(12) United States Patent
Cical et al.

(10) Patent No.: US 9,503,058 B1
(45) Date of Patent: Nov. 22, 2016

(54) RELAXATION OSCILLATOR

(71) Applicant: Xilinx, Inc., San Jose, CA (US)

(72) Inventors: Ionut C. Cical, Saggart (IE); John K. Jennings, Glenageary (IE); Edward Cullen, Clane (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/629,816

(22) Filed: Feb. 24, 2015

(51) Int. Cl.
  *H03K 3/011* (2006.01)
  *H03L 7/00* (2006.01)
  *H03K 3/0231* (2006.01)
  *G06F 1/08* (2006.01)

(52) U.S. Cl.
  CPC ............... *H03K 3/011* (2013.01); *G06F 1/08* (2013.01); *H03K 3/0231* (2013.01); *H03L 7/00* (2013.01)

(58) Field of Classification Search
  CPC .......... H03K 3/0231; H03L 7/00; G06F 1/08
  USPC ............................. 331/111, 143, 45, 74, 176
  See application file for complete search history.

(56) References Cited

U.S. PATENT DOCUMENTS

| | | | | |
|---|---|---|---|---|
| 7,598,822 B2* | 10/2009 | Rajagopal | ............ | H03K 3/0231 331/111 |
| 8,067,992 B2* | 11/2011 | Chen | ...................... | H03K 3/011 331/111 |
| 8,610,509 B2* | 12/2013 | Mohtashemi | .......... | H03K 3/354 331/109 |
| 2012/0194279 A1* | 8/2012 | Nonis | .................... | H03K 4/501 331/34 |

* cited by examiner

Primary Examiner — Arnold Kinkead
(74) Attorney, Agent, or Firm — LeRoy D. Maunu

(57) ABSTRACT

Various example implementations are directed to circuits and methods for generating a clock signal. According to an example embodiment, a circuit arrangement includes a relaxation oscillator configured to output a clock signal. The clock signal has an oscillation frequency dependent on a reference current provided to the relaxation oscillator, an operating temperature of the relaxation oscillator, and a supply voltage used to power the relaxation oscillator. The circuit arrangement also includes a current source coupled to the relaxation oscillator and configured to generate the reference current. The current source is configured to adjust the reference current, in response to a change in one or more of the temperature of the relaxation oscillator and the supply voltage, to inhibit change in the oscillation frequency of the clock signal.

19 Claims, 5 Drawing Sheets

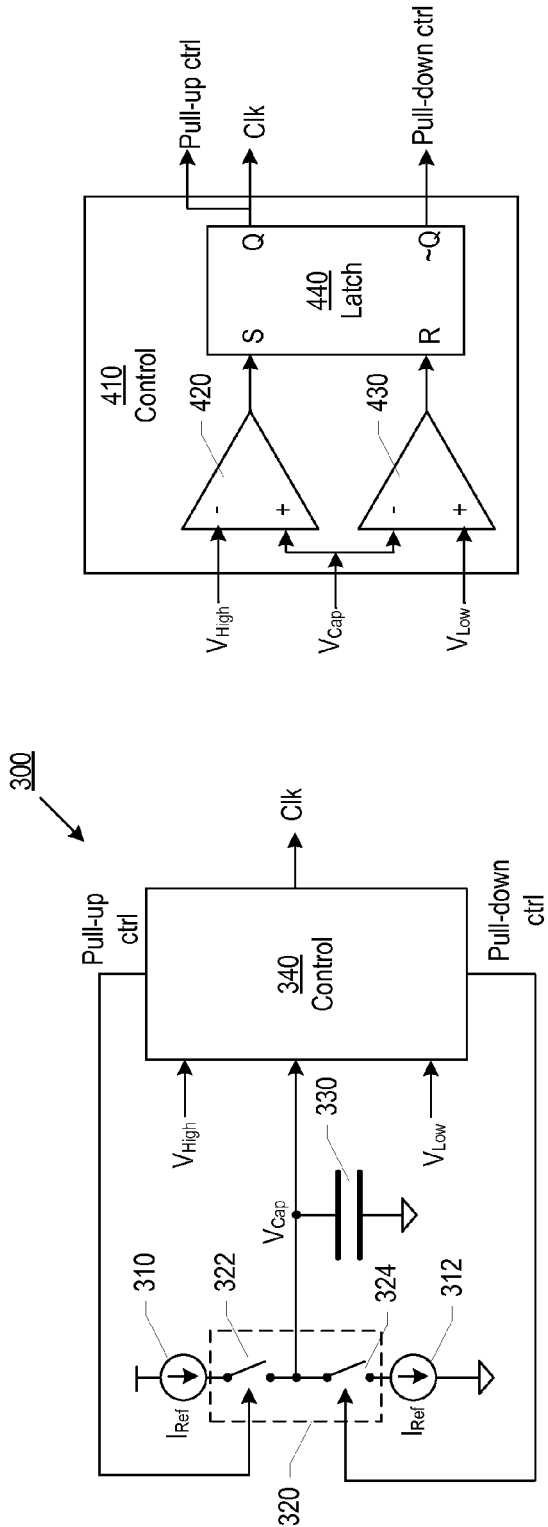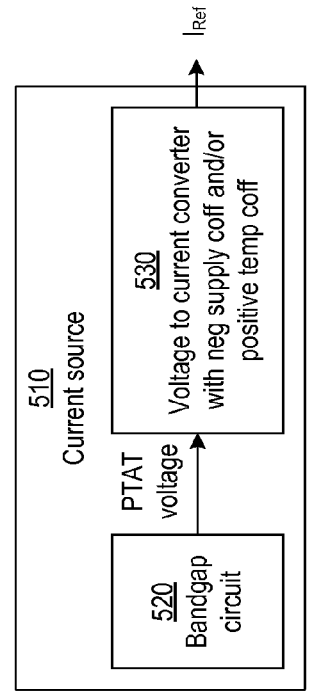
FIG. 4
FIG. 3
FIG. 5

RELAXATION OSCILLATOR

TECHNICAL FIELD

The disclosure generally relates to oscillator circuits, and more particularly to relaxation oscillator circuits.

Overview

A wide variety of computer and telecommunications devices coordinate operation of and/or communication by various circuits using dock signals. One of the critical challenges for circuit designers is managing timing of their designs. Precise control over timing and dock signals can improve performance and reliability. Controlling timing, however, is becoming increasingly difficult as circuits grow more complex and dock frequencies increase.

SUMMARY

Various example implementations are directed to circuits, apparatuses and methods for generating a clock signal. According to an example embodiment, an apparatus includes a relaxation oscillator configured to output a clock signal. The clock signal has an oscillation frequency dependent on a reference current provided to the relaxation oscillator, an operating temperature of the relaxation oscillator, and a supply voltage used to power the relaxation oscillator. The apparatus also includes a current source coupled to the relaxation oscillator and configured to generate the reference current. The current source is configured to adjust the reference current, in response to change in one or more of the temperature of the relaxation oscillator and the supply voltage, to inhibit change in the oscillation frequency of the clock signal.

A method for generating a clock signal is also disclosed. A reference current is generated with a current source. Using a relaxation oscillator, a clock signal having an oscillation frequency is generated. The oscillation frequency of the clock signal is dependent on a reference current provided to the relaxation oscillator, an operating temperature of the relaxation oscillator, and a supply voltage used to power the relaxation oscillator. The reference current generated by the current source is adjusted, in response to change in one or more of the temperature of the relaxation oscillator and the supply voltage, to inhibit change in the oscillation frequency of the clock signal.

Other features will be recognized from consideration of the Detailed Description and Claims, which follow.

BRIEF DESCRIPTION OF THE DRAWINGS

Various aspects and features of the disclosed apparatus and methods will become apparent upon review of the following detailed description and upon reference to the drawings in which:

FIG. 3 shows an example relaxation oscillator circuit, consistent with one or more implementations;

FIG. 4 shows an example control circuit, consistent with one or more implementations;

FIG. 5 shows a block diagram of an example current source, consistent with one or more implementations;

DETAILED DESCRIPTION

Figure 1:
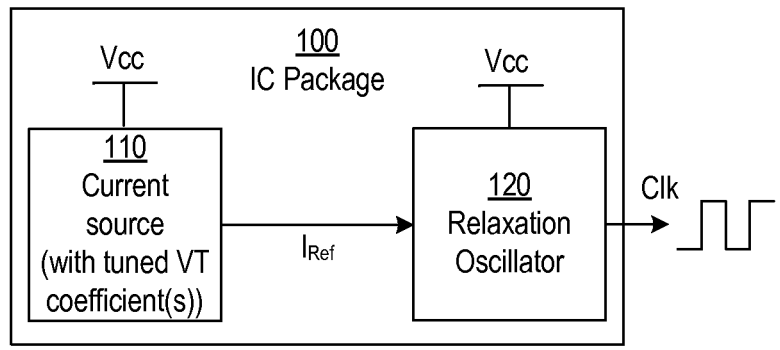
FIG. 1 shows an integrated circuit (IC) package including a current source and a relaxation oscillator circuit arrangement, consistent with one or more implementations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Circuit designs may utilize various types of circuits for generating dock signals of the required dock frequency including, for example, ring oscillators, phase locked loops (PLLs), and/or relaxation oscillators. Ring oscillators may generate clock signals that exhibit a high degree of variation in oscillation frequency over voltage-temperature (VT) corners during operation. PLLs can provide accurate clock signals over VT corners but require a larger circuit area. Relaxation oscillators generate clock signals having higher accuracy over VT corners in comparison to ring oscillators and require less circuit area in comparison to PLLs.

A relaxation oscillator is an oscillator circuit in which the frequency of oscillation is determined by the time to charge and/or discharge a capacitor (or other reactive element) to a threshold level. The relaxation oscillator includes switching and control circuits configured to alternate between charging a capacitor to a high voltage and discharging the capacitor to a low voltage. The control circuit generates an oscillating clock signal, for example, by setting a dock signal to a high voltage while the capacitor is charging and setting a dock signal to a low voltage while the capacitor is discharging. The period of a clock signal produced by the relaxation oscillator is determined by the total time to set switches to charge the capacitor, charge the capacitor to a high voltage, set the switches to discharge the capacitor, and discharge the capacitor to a low voltage.

It is recognized in this disclosure that switching and control circuits may introduce some variation in the oscillation frequency in response to variations in operating temperature and supply voltage. For instance, as temperature increases or supply voltage decreases, circuit speed decreases, thereby increasing the time to switch between charging and discharging of the capacitor. Conversely, as temperature decreases or supply voltage increases, circuit speed increases, thereby decreasing the time to switch between charging and discharging of the capacitor.

One or more implementations provide a mechanism to adjust the charge/discharge rate of the capacitor during operation to compensate for variation exhibited by the switching and to control circuit across VT corners, thereby inhibiting change in the oscillation frequency. In an example, a circuit includes a current source and relaxation oscillator configured to derive a clock signal from a reference current. The clock signal has an oscillation frequency that is dependent on the reference current, the operating temperature of the relaxation oscillator, and a supply voltage used to power the relaxation oscillator.

The current source is configured to generate a reference current for the relaxation oscillator that changes as the operating temperature of the relaxation oscillator and/or the supply voltage changes, in order to inhibit change in the oscillation frequency of the clock signal. For example, the current source may be configured to increase the reference current in response to an increase in the operating temperature of the apparatus. The increase in the reference current decreases the charge/discharge time to compensate for the increase in the time for switching/control circuits to switch between charging and discharging of the capacitor. Conversely, the current source may decrease the reference current in response to a decrease in the operating temperature of the apparatus. The decrease in the reference current increases the charge/discharge time to compensate for the decrease in the time for switching/control circuits to switch between charging and discharging of the capacitor.

As another example, in some implementations, the current source may be configured to decrease the reference current in response to an increase in the supply voltage. The decrease in the reference current increases the charge/discharge time to compensate for the decrease in the time to switch between charging and discharging of the capacitor as a result of the increased supply voltage. Conversely, the current source may decrease the reference current in response to an increase in the supply voltage. The decrease in the reference current decreases the charge/discharge time to compensate for the increase in the time to switch between charging and discharging of the capacitor as a result of the decreased supply voltage.

For ease of reference, changes in a voltage/current in relation to temperature may be quantified and referred to as a temperature coefficient. Similarly, changes in voltage/current in relation to supply voltage may be quantified and referred to as a supply coefficient. The temperature coefficient and/or supply coefficient of the reference current needed to compensate for changes in switching time of the relaxation oscillator during operation may be predetermined in a design stage. Some example processes for determining temperature and supply coefficients required for a particular relaxation oscillator are discussed in more detail with reference to FIGS. 7 and 8. After determining required temperature and/or supply coefficients of the reference current for a particular relaxation oscillator in a circuit design, a designer may pre-configure a corresponding current source in the circuit design to generate a reference current having the determined coefficient(s). During operation, changes in temperature and/or supply voltage that cause switching time to change in the relaxation oscillator also cause the current source to adjust the reference current by an amount that compensates for the change in switching time.

Various circuits may be used to implement the current source. In some implementations, the current source is configured to adjust the reference current according to an output signal of a temperature sensor placed in close proximity to the relaxation oscillator. The current source is configured to generate a reference current that increases/decreases in response to increases/decreases in the measured temperature of the relaxation oscillator, as described above. In some other implementations, the temperature sensor is omitted from the design. Rather, the current source is placed in close proximity to the relaxation oscillator in an IC package so that the operating temperature of the current source is approximately the same as the operating temperature of the relaxation oscillator. The current source is configured to generate a reference current that increases/decreases in response to increases/decreases in the operating temperature of the current source. For ease of explanation, the examples are primarily described with reference to a current source in close proximity to the relaxation oscillator and configured to increases/decreases the reference current in response to increases/decreases in the operating temperature of the current source.

In some implementations, the current source includes a bandgap circuit configured to generate a proportional to absolute temperature (PTAT) voltage. A PTAT voltage refers to a voltage that varies in proportion to the operating temperature of the circuit. A voltage-to-current converter is configured to generate the reference current from the PTAT voltage. The PTAT voltage increases/decreases in response to increases/decreases in the operating temperature of the circuits. The temperature coefficients of the PTAT voltage and/or voltage-to-current converter causes the reference current to increase/decrease in response to temperature changes, as described above. In some implementations, the temperature coefficient of the bandgap may be adjusted to compensate for the temperature coefficient exhibited by the relaxation oscillator. For instance, the bandgap may include a plurality of taps, each providing a PTAT voltage with a respective temperature coefficient.

The disclosed implementations may be applied to and used with various relaxation oscillator circuits. For ease of reference the examples are primarily described with reference to a relaxation oscillator including a capacitor and a switching circuit, and a control circuit. The switching circuit is configured to charge and discharge the capacitor with a current equal to a reference current. The switching circuit includes a pull-up switch configured to provide a current, equal to the reference current, to the capacitor in response to a first control signal. The switching circuit also includes a pull-down switch configured to drain a current, equal to the reference current, from the capacitor in response to a second control signal. The switching circuit includes a control circuit configured to set the first control signal to enable the pull-up switch in response to a voltage of the capacitor being less than a lower threshold voltage (e.g., 0.25V). The control circuit is also configured to set the second control signal to enable the pull-down switch in response to the voltage of the capacitor being greater than an upper threshold voltage (e.g., 3.0V).

The control circuit may be implemented differently in various implementations. In one example implementation, the control circuit includes first and second comparison circuits. The first comparison circuit determines when the voltage of the capacitor has exceeded the upper threshold voltage. The second comparison circuit determines when the voltage of the capacitor falls below the lower threshold voltage.

The control circuit is configured to set an output clock signal to a first value (e.g., logical 0) when the capacitor is being charged and set the clock signal to a second value (e.g., logical 1) when the capacitor is being discharged. In some implementations, the first comparison circuit triggers setting a latch in response to the voltage of the capacitor exceeding the upper threshold voltage. The second comparison circuit triggers a reset of the latch in response to the voltage of the capacitor falling below the lower threshold voltage. An output of the latch provides the output clock signal.

Turning now to the figures, FIG. 1 shows an IC package 100 including a current source 110 and a relaxation oscillator 120, consistent with one or more implementations. The relaxation oscillator is configured to generate a clock signal (Clk) from a reference current ($I_{Ref}$) produced by current source 110. The clock signal generated by the relaxation oscillator 120 has an oscillation frequency that is dependent on the reference current, an operating temperature of the relaxation oscillator, and a supply voltage (Vcc) used to power the relaxation oscillator. The current source 110 is in close proximity to the relaxation oscillator 120 in the IC package 100 so that the temperatures of the current source 110 and relaxation oscillator 120 are approximately the same. The current source 110 adjusts the reference current, in response to changes in temperature of the current source 110 and relaxation oscillator 120 to cause the reference current to exhibit voltage and/or temperature coefficients. The voltage and/or temperature coefficients exhibited by the reference current are tuned to reduce variation in the oscillation frequency of the clock signal resulting from changes in the operating temperature and/or the supply voltage.

Figure 2:
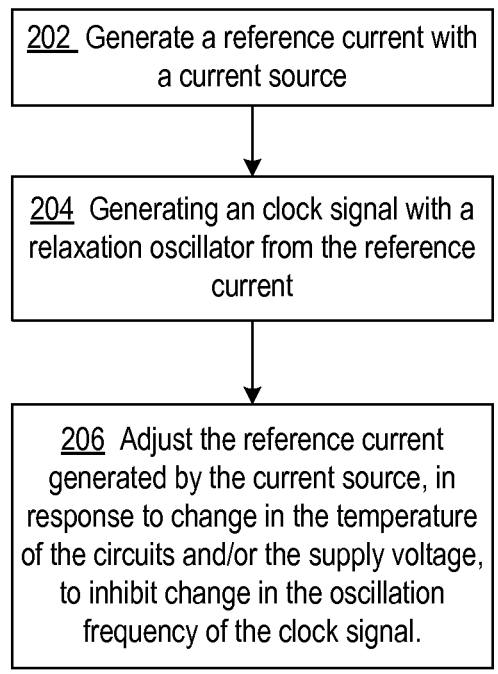
FIG. 2 shows a process for generating a clock signal, consistent with one or more implementations.

FIG. 2 shows a process for generating a clock signal, consistent with one or more implementations. A reference current is generated by a current source at block 202. Using a relaxation oscillator, a clock signal is generated in response to the reference current at block 204. As previously described, the clock signal has an oscillation frequency dependent on a reference current provided to the relaxation oscillator, an operating temperature of the relaxation oscillator, and a supply voltage used to power the relaxation oscillator. At block 206, the reference current generated by the current source is adjusted to inhibit change in the oscillation frequency of the clock signal. For example, as previously described, the current source may be preconfigured to generate a reference current having a temperature coefficient and/or supply coefficient that compensates for changes in switching time of the relaxation oscillator resulting from change in operating temperature or supply voltage. For instance, the current source may be configured to increase/decrease the reference current in response to increase/decrease of the operating temperature of the current source and relaxation oscillator.

FIG. 3 shows an example relaxation oscillator 300, consistent with one or more implementations. The relaxation oscillator includes switching circuit 320, a capacitor 330, a control circuit 340, and two current sources 310 and 312. Each of the current sources 310 and 312 is configured to provide a current equal to a reference current ($I_{Ref}$). The switching circuit 320 includes a pull-up switch 322 configured to provide the $I_{Ref}$ current from current source 310 to the capacitor 330 when enabled by a pull-up control signal. The switching circuit 320 also includes a pull-down switch 324 configured to drain the $I_{Ref}$ current from the capacitor 330 to the current source 312 when enabled by a pull-down control signal.

The control circuit 340 is configured to set the pull-up control signal to enable the pull-up switch 322 in response to a voltage of the capacitor 330 being less than a lower threshold voltage ($V_{Low}$). The control circuit is also configured to set the pull-down control signal to enable the pull-down switch 324 in response to the voltage of the capacitor 330 being greater than an upper threshold voltage ($V_{High}$). This functionality of the control circuit 340 causes the switching circuit 320 to alternate between charging a capacitor to a high voltage and discharging the capacitor to a low voltage. The control circuit generates an oscillating clock signal, for example, by setting the output clock signal to a high voltage while the capacitor is charging and setting a clock signal to a low voltage while the capacitor is discharging.

FIG. 4 shows an example control circuit, consistent with one or more implementations. In this example, the control circuit 410 includes a first comparison circuit 420 configured to determine when the voltage of the capacitor ($V_{cap}$) has exceeded the $V_{High}$ threshold voltage. The control circuit 410 also includes a second comparison circuit 430 configured to determine when the voltage of the capacitor ($V_{cap}$) has fallen below the $V_{Low}$ threshold voltage. The control circuit is configured to set an output clock signal to first value when the capacitor is being charged and set the clock signal to a second value when the capacitor is being discharged. In this example, the first comparison circuit 420 triggers a set of a latch 440 in response to the voltage of the capacitor exceeding the $V_{High}$ voltage. The second comparison circuit 430 triggers a reset of the latch in response to the voltage of the capacitor falling below the $V_{Low}$ voltage. An output (Q) of the latch 440 provides the output clock signal. In this example the output Q provides the pull-up control signal. An inverted output ~Q of the latch 440 provides the pull-down control signal.

With reference to the example circuits shown in FIGS. 3 and 4, the time period of a one oscillation of clock signal produced by the relaxation oscillator is determined by the total time to set the switches to charge the capacitor, charge the capacitor to a high voltage, set the switches to discharge the capacitor, and discharge the capacitor to a low voltage. The time period of a one oscillation ($T_{OSC}$) is given by $$T_{OSC} = 2*T_{Charge} + 4*T_{Det\&Sw} \qquad (1)$$

where $T_{Det\&Sw}$ is equal to the time needed for the control circuit 340 to detect the voltage of the capacitor exceeding $V_{High}$, or falling below $V_{Low}$, and cause the switching circuit 320/410 to switch between charging and discharging of the capacitor. In FIG. 4, the time for the switching circuit to detect the voltage passing a threshold and set the appropriate control signals is equal to the total delay exhibited by a comparator (e.g., 420) and the latch 440.

$T_{Charge}$ is equal to the time to charge the capacitor 330 from the $V_{Low}$ to $T_{Charge}$ is also equal to the time to discharge the capacitor 330 from the $V_{High}$ to $V_{Low}$. $T_{Charge}$ is given by $$T_{Charge} = C \cdot dV / i_{ref} \qquad (2)$$

wherein dV is equal to the $V_{High}$ threshold less the $V_{Low}$ threshold. Combining equations 1 and 2, the time period of a one oscillation becomes $$T_{Osc} = 2*C*\frac{dV}{i_{ref}} + 4*T_{Det\&Sw} \qquad (3)$$

and the oscillation frequency becomes $$F_{Osc} = \frac{1}{2*C*\frac{dV}{i_{ref}} + 4*T_{Det\&Sw}} \qquad (4)$$

As shown in equation 4 the oscillation frequency for a oscillator having a fixed capacitance is dependent on the speed of the switching circuit 320 and the control circuit 340 and $I_{ref}$. As previously described, the speed of the switching circuit 320 and the control circuit 340 (i.e., $T_{Det\&Sw}$) may vary in response to changes in operating temperature or in a supply voltage used to power the circuits.

In various implementations, a current source that provides the reference current to the relaxation oscillator is configured to adjust the reference current to exhibit voltage and/or temperature coefficients. Adjustment of the reference current, corresponding to the voltage and/or temperature coefficients, is tuned to compensate for variation in the oscillation frequency resulting from a change in the operating temperature and/or the supply voltage.

For example, as described above, the current source may increase the $I_{ref}$ in response to an increase in the operating temperature of the apparatus. The increase in the $I_{ref}$ decreases $T_{Charge}$ to compensate for the increase in $T_{Det\&sw}$. Conversely, the current source may decrease $I_{ref}$ in response to a decrease in the operating temperature of the apparatus. The decrease in the reference current increases $T_{Charge}$ to compensate for the decrease in $T_{Det/Sw}$. As another example, the current source may decrease the $I_{ref}$ in response to an increase in the supply voltage. The decrease in the $I_{ref}$ increases the $T_{charge}$ to compensate for the decrease in the $T_{Det\&Sw}$. Conversely, the current source may decrease the $I_{ref}$ in response to an increase in the supply voltage. The decrease in the $I_{ref}$ decreases the $T_{Vharge}$ to compensate for the increase in the $T_{Det\&Dw}$.

FIG. 5 shows a block diagram of an example current source consistent with one or more implementations. In this example, the current source 510 includes a bandgap circuit 520 configured to generate a PTAT voltage. A voltage-to-current converter 530 is configured to generate the reference current from the PTAT voltage. The PTAT voltage exhibits a first temperature coefficient. The first temperature coefficient of the PTAT voltage in addition to a second temperature coefficient of the voltage-to-current converter 530 (if any) causes the reference current to increase/decrease in response to temperature changes. As described above, the temperature coefficients of the PTAT voltage and voltage-to-current converter 530 are set to cause the reference current to induce change in the oscillation frequency that is inversely proportional to change induced by the switching circuit 320 and control circuit 340.

In some implementations, the temperature coefficient of the PTAT voltage may be adjustable by a designer. For instance, the temperature coefficient of the PTAT voltage may be adjusted to cause the reference current generated by the current source exhibit a desired temperature coefficient.

The configurability of the current source allows the current source to be provided as a logic core that can be easily incorporated into a larger circuit design and reconfigured by a designer for use with various relaxation oscillators. For instance, a relaxation oscillator in a circuit design may exhibit a first temperature coefficient when implemented on a first type of programmable IC but may exhibit a second temperature coefficient when implemented on a second type of programmable IC. In the design process, a designer may determine required temperature and supply coefficients of the reference current to compensate for a particular relaxation oscillator. After the required temperature and supply coefficients are determined, the current source may be configured accordingly. Some example processes for determining temperature and supply coefficients required for a particular relaxation oscillator are discussed in more detail with reference to FIGS. 7 and 8.

In different implementations, the current source may include various mechanisms for adjusting the temperature coefficient of the PTAT voltage. In some implementations, the bandgap may include a plurality of taps, each providing a PTAT voltage with a respective temperature coefficient. A designer may adjust the temperature coefficient by selecting different ones of the taps as an output of the bandgap circuit. In some implementations, the voltage-to-current converter 530 is additionally or alternatively configured to adjust the reference current to exhibit a desired temperature coefficient. As another example, the voltage-to-current converter 530 may be additionally or alternatively configured to adjust the reference current exhibit a negative supply coefficient.

Figure 6:
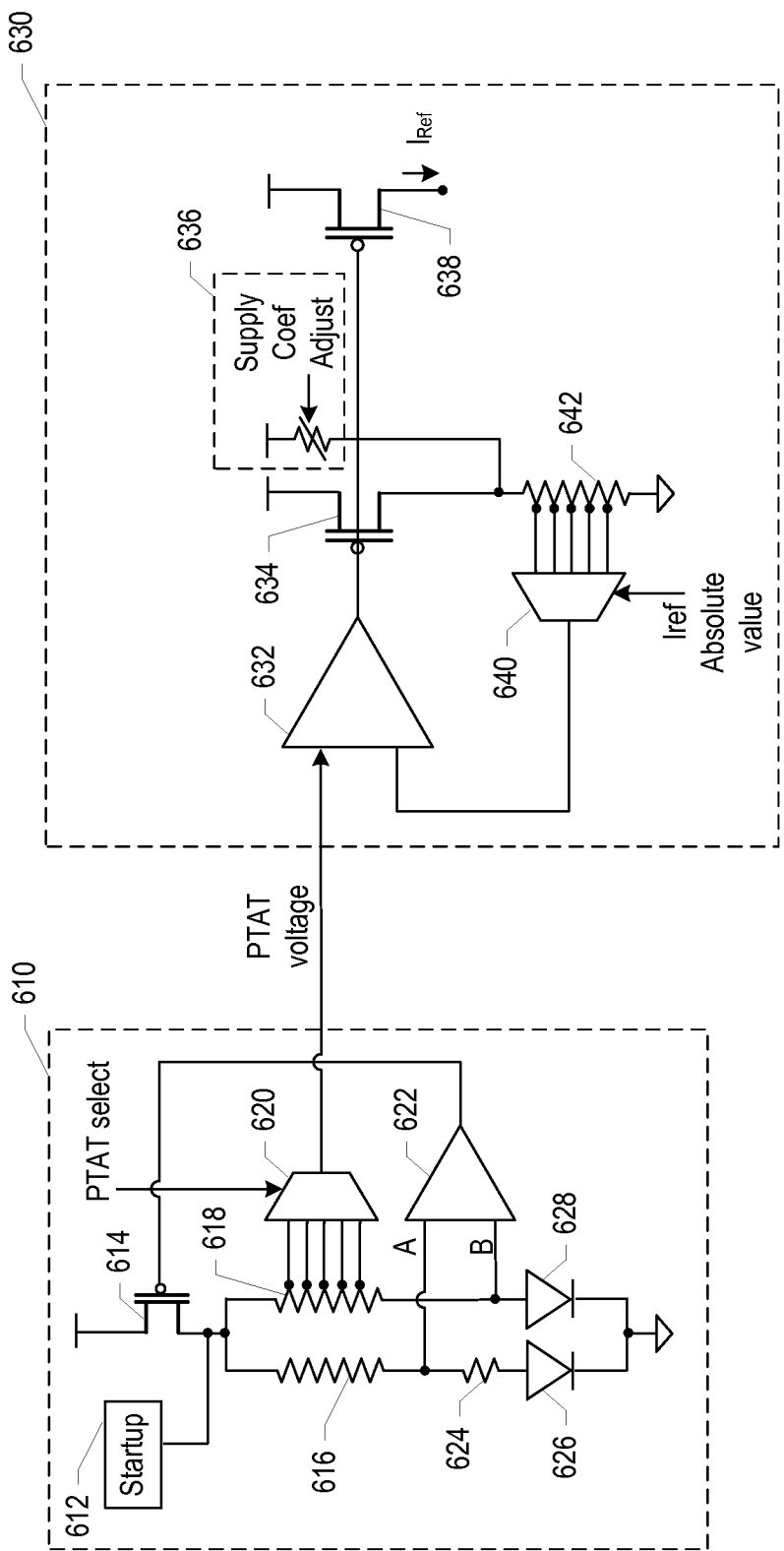
FIG. 6 shows a circuit diagram of an example current source, consistent with one or more implementations.

FIG. 6 shows a circuit diagram of an example current source, consistent with one or more implementations. The current source includes a bandgap circuit 610 and a voltage-to-current circuit 630 as described with reference to circuits 520 and 530 in FIG. 5. The bandgap circuit 610 generates a plurality of PTAT voltages. As previously indicated, PTAT voltages exhibit vary as a function of operating temperature of the circuits. The PTAT voltages may be used to generate a reference current having a desired temperature coefficient. The bandgap circuit 610 includes two paths from current source 614 to ground. A first path includes resistor 616, node A, resistor 624, and diode 626. A second path includes resistor 618, node B and diode 628. Inputs of difference amp 622 are connected to nodes A and B. A voltage at Node A corresponds to a voltage drop across resistor 624 and diode 626. A voltage at Node B corresponds to a voltage drop across diode 628. When operating in a stable state, a difference amplifier 622 adjusts current passed by current source 614, based on a voltage difference between nodes A and B, to cause the voltage on node A to be the same as the voltage on node B. The adjustment by the difference amplifier 622 induces a PTAT current through resistor 618. In some implementations, the bandgap circuit 610 may include a start-up circuit 612 to induce an initial current to place the bandgap circuit into the stable state. In this example, the resistor 618 includes a plurality of taps each providing a voltage having a respective temperature coefficient. Multiplexer 620 is configured to output a reference voltage from one of the resistor taps indicated by a PTAT select signal. The PTAT select signal may be set by a designer to cause PTAT signal having the desired temperature coefficient to be provided to the voltage-to-current converter 630. The value of the PTAT select signal may be determined, for example, in a design phase for a circuit design and stored as a fixed value in a non-volatile memory. During operation, the value may be retrieved from the memory and provided to the multiplexer 620 as the PTAT select signal.

The voltage-to-current converter 630 is configured to generate the reference current $I_{Ref}$ from the PTAT reference voltage. In this example, the voltage-to-current converter 630 includes a difference amplifier 632 configured to generate a voltage proportional to a difference between the PTAT voltage and a voltage provided on a feedback path. The output of the difference amplifier 632 drives a gate of transistor 638, which provides $I_{Ref}$. The output of the difference amplifier 632 also drives a gate of transistor 634 included in the feedback path. The transistor 634 a transistor having a first source/drain coupled to a supply voltage and a second source/drain coupled to a current path to a ground voltage. The transistor 634 passes a current, proportional to the voltage output by the difference amplifier 632, through tapped resistor 642 to the ground voltage. Multiplexer 640, provides a voltage from a tapped resistor 642, indicated by $I_{Ref}$ absolute value signal, to an input of the difference amplifier 632. The tap that is connected to the input of the difference amplifier 632 determines a baseline amperage of the output $I_{Ref}$ current when operated at absolute zero. The Iref absolute value signal may be set as required to achieve a desired baseline current. In some implementations, multiplexer 640 and tapped resistor 642 may be replaced with a static resistor bridge circuit.

In some implementations, the PTAT voltage exhibits a positive temperature coefficient, and elements of the feedback path 624, 640, and 642 and difference amplifier 632 exhibit a second temperature coefficient. The output $I_{Ref}$ current exhibits a temperature coefficient proportional to a difference between the first and second temperature coefficients.

In some implementations, the voltage-to-current converter 630 may alternatively or additionally include a circuit configured to cause the output $I_{Ref}$ current to exhibit a negative voltage coefficient. In this example, resistor 636 provides a current having a positive voltage coefficient to a node between the transistor 634 and tapped resistor 642. If the supply voltage increases, current through resistor 636 increases, which causes current through transistors 634 and 638 to decrease. As a result, the output $I_{Ref}$ current decreases in response to the increase in the supply voltage. In this example, resistor 636 is a variable resistor that may be adjusted by a supply coefficient adjust signal to set the voltage coefficient exhibited in the $I_{Ref}$ current.

The PTAT select, Iref absolute value, and/or supply coefficient adjust signals may be adjusted by a designer to generate an $I_{ref}$ current with desired amperage and temperature/voltage coefficients for a particular application. In a design stage of a circuit design, a designer may determine temperature and/or supply coefficients of a reference current to compensate for variation of switching speed exhibited by a particular relaxation oscillator included in the circuit design. The required temperature and/or supply coefficients may be determined mathematically or experimentally, for example, via simulation of the relaxation oscillator.

Figures 7, 8:
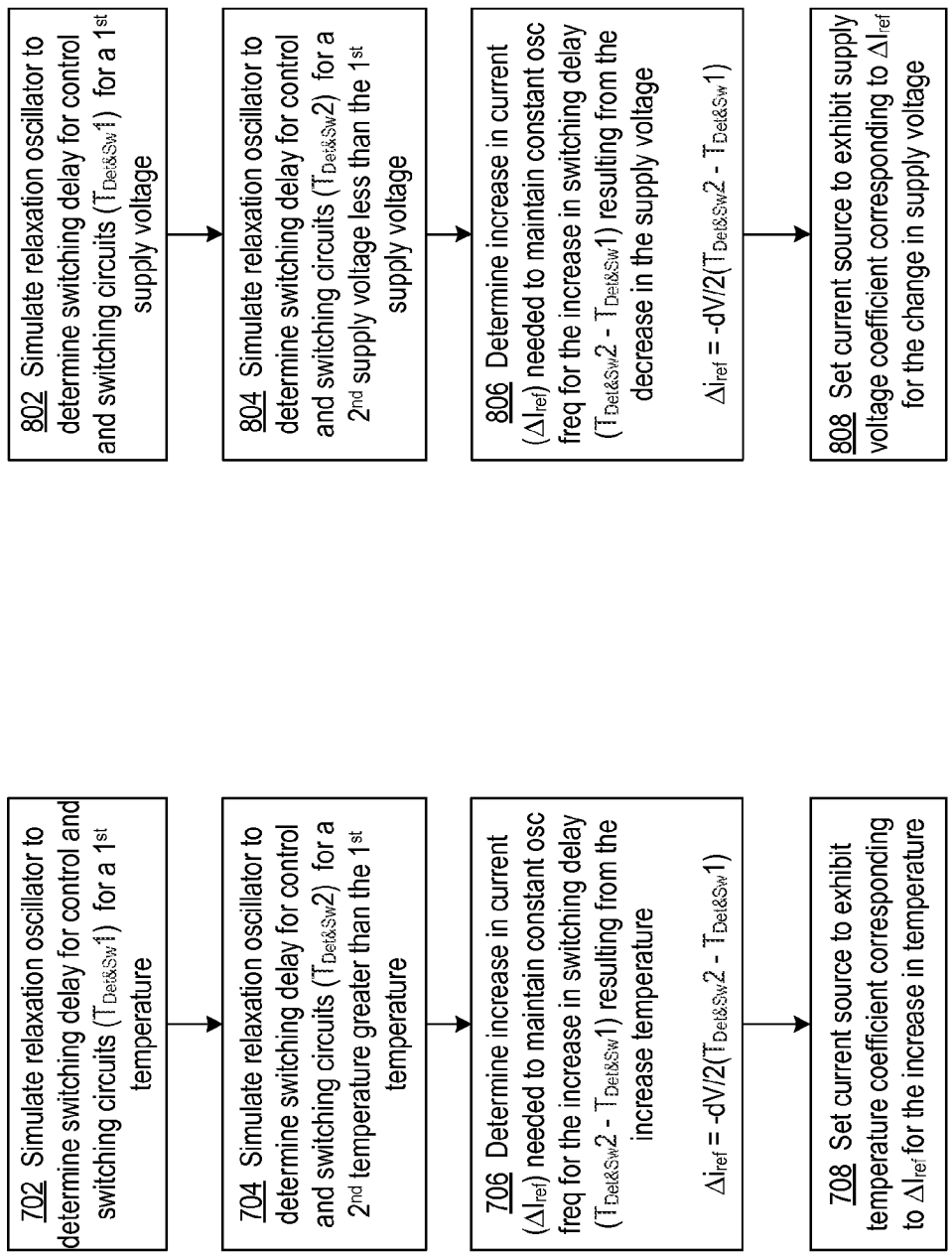
FIG. 7 shows a process for configuring a temperature coefficient of the current source, consistent with one or more implementations.
FIG. 8 shows a process for configuring a supply voltage coefficient of the current source, consistent with one or more implementations.

FIG. 7 shows a process for configuring a temperature coefficient of the current source in a design stage, consistent with one or more implementations. At block 702, the relaxation oscillator is simulated to determine switching delay for control and switching circuits (i.e., $T_{Det\&Sw}1$) for a 1$^{st}$ temperature. At block 704, the relaxation oscillator is simulated to determine switching delay for control and switching circuits (i.e., $T_{Det\&Sw}2$) for a 2$^{nd}$ temperature greater than the 1$^{st}$ temperature. At block 706, an increase in current ($\Delta I_{ref}$) is determined that maintains constant oscillation frequency for the increase in switching delay ($T_{Det\&Sw}2-T_{Det\&Sw}$ resulting from the increase in temperature. The change in the $I_{ref}$ current may be described by $$\Delta I_{ref} = -dV/2(T_{Det\&Sw}2-T_{Det\&Sw}1)$$

At block 708, the current source is set to exhibit a temperature coefficient corresponding to $\Delta I_{ref}$ for the increase in temperature.

FIG. 8 shows a process for configuring supply voltage coefficient of the current source in a design stage, consistent with one or more implementations. At block 802, the relaxation oscillator is simulated to determine switching delay for control and switching circuits (i.e., $T_{Det\&Sw}1$) for a 1$^{st}$ supply voltage. At block 804, the relaxation oscillator is simulated to determine switching delay for control and switching circuits (i.e., $T_{Det\&Sw}2$) for a 2$^{nd}$ supply voltage less than the 1$^{st}$ supply voltage. At block 806, an increase in current ($\Delta I_{ref}$) is determined that maintains constant oscillation frequency for the increase in switching delay ($T_{Det\&Sw}2-T_{Det\&Sw}1$) resulting from the decrease in supply voltage. The change in the $I_{ref}$ current may be described by $$\Delta I_{ref} = -dV/2(T_{Det\&Sw}2-T_{Det\&Sw}1)$$

At block 808, the current source is set to exhibit temperature coefficient corresponding to $\Delta I_{ref}$ for the increase in temperature.

FIGS. 7 and 8 described design stage processes for configuring a current source to generate a reference voltage exhibiting temperature and supply coefficients to compensate for variation in switching speed exhibited by a relaxation oscillator. During operation, the configured circuits of the current source and the relaxation oscillator operates as described with reference to the process shown in FIG. 2.

Figure 9:
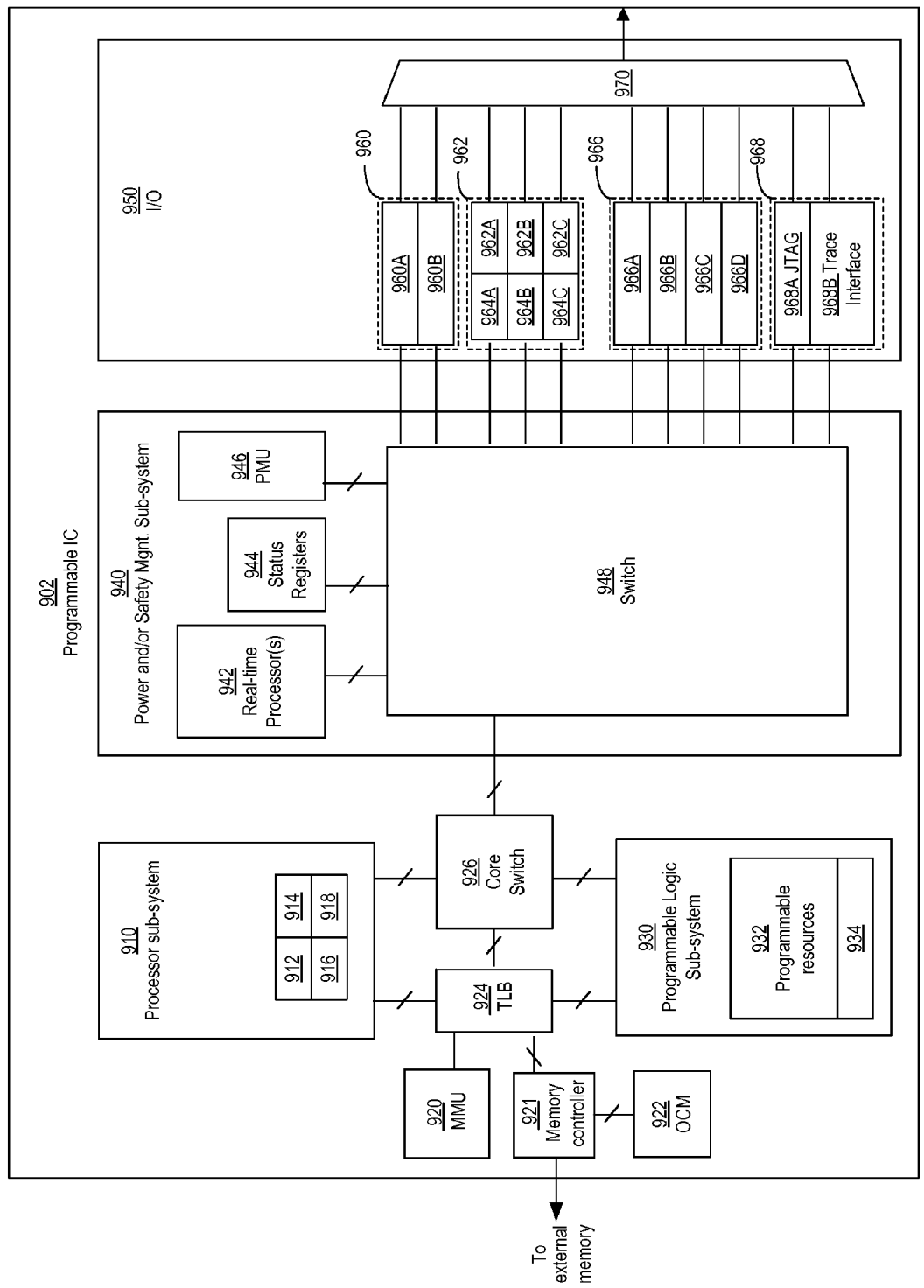
FIG. 9 shows a programmable IC on which the disclosed circuits and processes may be implemented.

FIG. 9 shows a programmable IC 902 that may be configured in accordance with one or more implementations. The programmable IC may also be referred to as a System On Chip (SOC), which includes a processing sub-system 910 and a programmable logic sub-system 930. The processing sub-system 910 may be programmed to implement a software portion of the user design, via execution of a user program. The program may be specified as part of a configuration data stream or may be retrieved from an on-chip or off-chip data storage device. The processing sub-system 910 may include various circuits 912, 914, 916, and 918 for executing one or more software programs. The circuits 912, 914, 916, and 918 may include, for example, one or more processor cores, floating point units (FPUs), an interrupt processing unit, on chip-memory, memory caches, and/or cache coherent interconnect.

The programmable logic sub-system 930 of the programmable IC 902 may be programmed to implement a hardware portion of a user design. For instance, the programmable logic sub-system may include a number of programmable resources 932, which may be programmed to implement a set of circuits specified in a configuration data stream. The programmable resources 932 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 932 may be programmed by loading a configuration data stream into the configuration memory cells, which define how the programmable interconnect circuits and programmable logic circuits are configured. The collective states of the individual memory cells then determine the function of the programmable resources 932. The configuration data can be read from memory (e.g., from an external PROM) or written into the programmable IC 902 by an external device. In some implementations, configuration data may be loaded into configuration memory cells by a configuration controller 934 included in the programmable logic sub-system 930. In some other implementations, the configuration data may be loaded into the configuration memory cells by a start-up process executed by the processor sub-system 910.

The programmable IC 902 may include various circuits to interconnect the processing sub-system 910 with circuitry implemented within the programmable logic sub-system 930. In this example, the programmable IC 902 includes a core switch 926 that can route data signals between various data ports of the processing sub-system 910 and the programmable logic sub-system 930. The core switch 926 may also route data signals between either of the programmable logic or processing sub-systems 910 and 930 and various other circuits of the programmable IC, such as an internal data bus. Alternatively or additionally, the processing sub-system 910 may include an interface to directly connect with the programmable logic sub-system—bypassing the core switch 926. Such an interface may be implemented, for example, using the AMBA AXI Protocol Specification (AXI) as published by ARM.

In some implementations, the processing sub-system 910 and the programmable logic sub-system 930 may also read or write to memory locations of an on-chip memory 922 or off-chip memory (not shown) via memory controller 921. The memory controller 921 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 921 is able to communicate is provided for purposes of illustration only and is not intended as a limitation or to be exhaustive. As shown in FIG. 9, the programmable IC 902 may include a memory management unit 920 and translation look-aside buffer 924 to translate virtual memory addresses used by the sub-systems 910 and 930 to physical memory addresses used by the memory controller 921 to access specific memory locations.

The programmable IC may include an input/output (I/O) sub-system 950 for communication of data with external circuits. The I/O sub-system 950 may include various types of I/O devices or interfaces including for example, flash memory type I/O devices, higher performance I/O devices, lower performance interfaces, debugging I/O devices, and/or RAM I/O devices.

The I/O sub-system 950 may include one or more flash memory interfaces 960 illustrated as 960A and 960B. For example, one or more of flash memory interfaces 960 can be implemented as a Quad-Serial Peripheral Interface (QSPI) configured for 4-bit communication. One or more of flash memory interfaces 960 can be implemented as a parallel 8-bit NOR/SRAM type of interface. One or more of flash memory interfaces 960 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 950 can include one or more interfaces 962 providing a higher level of performance than flash memory interfaces 960. Each of interfaces 962A-962C can be coupled to a DMA controller 964A-964C respectively. For example, one or more of interfaces 962 can be implemented as a Universal Serial Bus (USB) type of interface. One or more of interfaces 962 can be implemented as a gigabit Ethernet type of interface. One or more of interfaces 962 can be implemented as a Secure Digital (SD) type of interface.

The I/O sub-system 950 may also include one or more interfaces 966 such as interfaces 966A-966D that provide a lower level of performance than interfaces 962. For example, one or more of interfaces 966 can be implemented as a General Purpose I/O (GPIO) type of interface. One or more of interfaces 966 can be implemented as a Universal Asynchronous Receiver/Transmitter (UART) type of interface. One or more of interfaces 966 can be implemented in the form of a Serial Peripheral Interface (SPI) bus type of interface. One or more of interfaces 966 can be implemented in the form of a Controller-Area-Network (CAN) type of interface and/or an I²C type of interface. One or more of interfaces 966 also can be implemented in the form of a Triple Timer Counter (TTC) and/or a Watchdog Timer (WDT) type of interface.

The I/O sub-system 950 can include one or more debug interfaces 968 such as processor JTAG (PJTAG) interface 968A and a trace interface 968B. PJTAG interface 968A can provide an external debug interface for the programmable IC 902. Trace interface 968B can provide a port to receive debug, e.g., trace, information from the processing sub-system 910 or the programmable logic sub-system 930.

As shown, each of interfaces 960, 962, 966, and 968 can be coupled to a multiplexer 970. Multiplexer 970 provides a plurality of outputs that can be directly routed or coupled to external pins of the programmable IC 902, e.g., balls of the package within which the programmable IC 902 is disposed. For example, I/O pins of programmable IC 902 can be shared among interfaces 960, 962, 966, and 968. A user can configure multiplexer 970, via a configuration data stream to select which of interfaces 960-968 are to be used and, therefore, coupled to I/O pins of programmable IC 902 via multiplexer 970. The I/O sub-system 950, may also include a fabric multiplexer I/O (FMIO) interface (not shown) to connect interfaces 962-968 to programmable logic circuits of the programmable logic sub-system. Additionally or alternatively, the programmable logic sub-system 930 can be configured to implement one or more I/O circuits within programmable logic. In some implementations, the programmable IC 902 may also include a sub-system 940 having various circuits for power and/or safety management. For example, the sub-system 940 may include a power management unit 946 configured to monitor and maintain one or more voltage domains used to power the various sub-systems of the programmable IC 902. In some implementations, the power management unit 946 may disable power of individual sub-systems, when idle, to reduce power consumption, without disabling power to sub-systems in use.

The sub-system 940 may also include safety circuits to monitor the status of the sub-systems to ensure correct operation. For instance, the sub-system 940 may include one or more real-time processors 942 configured to monitor the status of the various sub-systems (e.g., as indicated in status registers 944). The real-time processors 942 may be configured to perform a number of tasks in response to detecting errors. For example, for some errors, the real-time processors 942 may generate an alert in response to detecting an error. As another example, the real-time processors 942 may reset a sub-system to attempt to restore the sub-system to correct operation. The sub-system 940 includes a switch network 948 that may be used to interconnect various sub-systems. For example, the switch network 948 may be configured to connect the various sub-systems 910, 930, and 940 to various interfaces of the I/O sub-system 950. In some applications, the switch network 948 may also be used to isolate the real-time processors 942 from the sub-systems that are to be monitored. Such isolation may be required by certain application standards (e.g., IEC-61508 SIL3 or ISO-26262 standards) to ensure that the real-time processors 942 are not affected by errors that occur in other sub-systems.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A circuit arrangement, comprising:
a relaxation oscillator configured to generate a clock signal having an oscillation frequency dependent on a reference current provided to the relaxation oscillator, an operating temperature of the relaxation oscillator, and a supply voltage used to power the relaxation oscillator, wherein the relaxation oscillator includes:
a capacitor;
a first switch configured to provide a current to the capacitor in response to a first control signal;
a second switch configured to drain the current from the capacitor in response to a second control signal; and
a control circuit configured to:
set the first control signal to enable the first switch in response to a voltage of the capacitor being less than a first threshold voltage; and
set the second control signal to enable the second switch in response to the voltage of the capacitor being greater than a second threshold voltage; and
a current source coupled to the relaxation oscillator and configured to:
generate the reference current;
inhibit change in the oscillation frequency of the clock signal by adjusting the reference current in response to change in one or more of the operating temperature of the relaxation oscillator and the supply voltage; and
decrease the reference current in response to an increase in the supply voltage;
wherein the oscillation frequency of the clock signal is dependent on a switching delay exhibited by the control circuit; and
wherein the switching delay exhibited by the control circuit varies in response to a change in the operating temperature of the relaxation oscillator or the supply voltage.

2. The circuit arrangement of claim 1, wherein the current source is configured to increase the reference current in response to an increase in the operating temperature of the relaxation oscillator.

3. The circuit arrangement of claim 1, wherein the control circuit includes:
a first comparison circuit configured to compare the voltage of the capacitor to the first threshold voltage;
a second comparison circuit configured to compare the voltage of the capacitor to the second threshold voltage; and
a latch having a first input coupled to an output of the first comparison circuit and a second input coupled to an output of the second comparison circuit.

4. The circuit arrangement of claim 1, wherein the current source includes:
a bandgap circuit configured to generate a proportional to absolute temperature (PTAT) voltage; and
a voltage-to-current converter coupled to receive the PTAT voltage from the bandgap circuit and configured to generate the reference current from the PTAT voltage.

5. The circuit arrangement of claim 4, wherein the bandgap circuit includes a plurality of taps each providing a reference voltage with a respective temperature coefficient.

6. A circuit arrangement comprising:
a relaxation oscillator configured to generate a clock signal having an oscillation frequency dependent on a reference current provided to the relaxation oscillator, an operating temperature of the relaxation oscillator, and a supply voltage used to power the relaxation oscillator; and
a current source coupled to the relaxation oscillator and configured to:
generate the reference current; and
inhibit change in the oscillation frequency of the clock signal by adjusting the reference current in response to change in one or more of the operating temperature of the relaxation oscillator and the supply voltage;
wherein the current source includes:
a bandgap circuit configured to generate a proportional to absolute temperature (PTAT) voltage; and
a voltage-to-current converter coupled to receive the PTAT voltage from the bandgap circuit and configured to generate the reference current from the PTAT voltage; and
wherein the voltage-to-current converter includes:
a difference amp having a first input coupled to receive the PTAT voltage and a second input coupled to a feedback path; and
a transistor having a first source/drain coupled to a supply voltage, a gate coupled to an output of the difference amp, and a second source/drain coupled to the feedback path.

7. The circuit arrangement of claim 6, wherein the feedback path includes a resistor coupled between the second source/drain and a ground voltage, wherein the resistor has a tap coupled to the second input of the difference amp.

8. The circuit arrangement of claim 7, wherein:
the PTAT voltage exhibits a first positive temperature coefficient;
a current path through the resistor exhibits a second temperature coefficient; and
the reference current output by the voltage-to-current converter exhibits a positive temperature coefficient proportional to a difference between the first and second temperature coefficients.

9. The circuit arrangement of claim 8, wherein the voltage-to-current converter further includes a second resistor coupled between the supply voltage and the second source/drain, wherein the second resistor causes the reference current output by the voltage-to-current converter to exhibit a negative supply voltage coefficient.

10. A method, comprising:
simulating operation of the relaxation oscillator to determine a first switching delay exhibited by the control circuit and the switching circuit for a first value of an operating parameter selected from a group consisting of supply voltage and operating temperature;
simulating operation of the relaxation oscillator to determine a second switching delay exhibited by the control circuit and the switching circuit for a second value of the operating parameter;
determining an increase in current to maintain a constant oscillation frequency of the clock signal for the first and second switching delays;
setting voltage or temperature coefficients of the current source to cause the reference current to exhibit a voltage coefficient or temperature coefficient corresponding to the determined increase in current; and
wherein the relaxation oscillator is connected to the current source and is configured to generate a clock signal having an oscillation frequency dependent on the reference current provided to the relaxation oscillator, an operating temperature of the relaxation oscillator, and a supply voltage used to power the relaxation oscillator.

11. The method of claim 10, further comprising adjusting of the reference current includes increasing the reference current in response to an increase in the operating temperature of the relaxation oscillator.

12. The method of claim 10, further comprising adjusting of the reference current includes decreasing the reference current in response to an increase in the supply voltage.

13. The method of claim 10, wherein the current source includes:
   a bandgap circuit configured to generate a reference voltage exhibiting a positive temperature coefficient; and
   a voltage-to-current converter coupled to receive the reference voltage from the bandgap circuit and generate the reference current reference voltage.

14. The method of claim 10, further comprising generating of the clock signal using the relaxation oscillator by:
   charging a capacitor with a current equal to the reference current in response to a voltage stored by the capacitor being less than a first threshold voltage; and
   discharging the capacitor with a current equal to the reference current in response to the voltage stored by the capacitor being greater than a second threshold voltage.

15. The method of claim 14, wherein the generating of the clock signal further includes:
   setting the clock signal to a first voltage in response to the voltage stored by the capacitor being less than the first threshold voltage; and
   setting the clock signal to a second voltage in response to the voltage stored by the capacitor being greater than the second threshold voltage.

16. The method of claim 14, wherein the charging and discharging of the capacitor includes:
   using a control circuit, comparing the voltage stored by the capacitor to the first and second threshold voltages; and
   using a switching circuit:
      providing the current equal to the reference current to the capacitor in response to the voltage stored by the capacitor being less than the first threshold voltage; and
      draining the current equal to the reference current from the capacitor in response to the voltage stored by the capacitor being greater than the second threshold voltage.

17. The method of claim 16, wherein the setting of the current source includes setting the current source to cause the reference voltage to exhibit a temperature coefficient corresponding to the determined increase in current.

18. The method of claim 16, wherein the setting of the current source includes setting the current source to cause the reference voltage to exhibit a voltage coefficient corresponding to the determined increase in current.

19. The circuit arrangement of claim 4, wherein the voltage-to-current converter is configured to, when operated at absolute zero, cause the reference to exhibit a baseline amperage indicated by an $I_{Ref}$ absolute value signal.

* * * * *